United States Patent
Gass et al.

(10) Patent No.: US 6,591,703 B2
(45) Date of Patent: Jul. 15, 2003

(54) HERMETICALLY ENCAPSULATED SENSOR AND PROCESS FOR ITS PRODUCTION

(75) Inventors: Ernst Gass, Stuttgart (DE); Michael Fritton, Wernau (DE); Josef Mayer, Köngen (DE); Walter Roth, Wolfschlugen (DE)

(73) Assignee: Balluff GmbH, Neuhausen/Filder (DE)

( * ) Notice: Subject to any disclaimer, the term of this patent is extended or adjusted under 35 U.S.C. 154(b) by 22 days.

(21) Appl. No.: 09/847,456

(22) Filed: May 2, 2001

(65) Prior Publication Data

US 2001/0038883 A1 Nov. 8, 2001

(30) Foreign Application Priority Data

May 5, 2000 (DE) .......................................... 100 21 672

(51) Int. Cl.⁷ ............................................... G01D 21/00
(52) U.S. Cl. ........................... 73/866.5; 73/431; 29/595
(58) Field of Search ................................ 73/866.5, 431, 73/866.1; 29/595

(56) References Cited

U.S. PATENT DOCUMENTS

| | | | |
|---|---|---|---|
| 4,847,557 A | * 7/1989 | Saito et al. | ................ 324/208 |
| 5,039,942 A | * 8/1991 | Buchschmid et al. | ....... 324/174 |
| 5,351,388 A | * 10/1994 | Van Den Berg et al. | ... 29/602.1 |
| 5,589,808 A | * 12/1996 | Clark et al. | ................... 336/92 |
| 5,789,920 A | 8/1998 | Gass | |

FOREIGN PATENT DOCUMENTS

JP 75961 * 3/1990

* cited by examiner

Primary Examiner—Daniel S. Larkin
Assistant Examiner—Nashmiya Fayyaz
(74) Attorney, Agent, or Firm—Ostrolenk, Faber, Gerb & Soffen, LLP

(57) ABSTRACT

A sensor has a housing, in which there is arranged a thermosetting molding compound which is encapsulated in a linear region in the longitudinal direction of the housing by a thermoplastic molding compound. The two molding compounds meet at a conical contact surface. An electrical terminal element is electrically connected to a printed-circuit board via lines. The printed-circuit board is embedded into the two molding compounds at the level of the center line, the thermosetting molding compound enclosing all the electrically active components and conductor tracks of the printed-circuit board. Annular grooves are arranged on the outer side of the thermosetting molding compound. Due to the encapsulation, the thermoplastic molding compound engages in these annular grooves in a positively and non-positively engaging manner. The groove arrangement has the advantage that effective sealing is ensured both when there is an increase in the temperature and when there is a decrease in the temperature of the sensor, since either the one groove surfaces or the other groove surfaces provide effective sealing on account of the respectively differing material expansion of the two molding compounds.

14 Claims, 2 Drawing Sheets

HERMETICALLY ENCAPSULATED SENSOR AND PROCESS FOR ITS PRODUCTION

BACKGROUND OF THE INVENTION

The present invention relates to a sensor with an electric circuit which is arranged on a support and is connected to an electrical terminal element and to a sensor element, and with a housing with an interior space for receiving the support with the electric circuit, which has an opening for the terminal element and an opening for the sensor element. The sensor element and at least part of the support with the electric circuit is embedded in a thermosetting molding compound. Moreover, the invention relates to a process for producing such a sensor.

A sensor of the generic type and a process for its production are known from German reference DE 195 44 815 C1. This sensor has an electric circuit which is arranged on a support and is connected to an electrical terminal element and to a sensor element. The support is accommodated in a housing of the sensor which has an opening for the terminal element and an opening for the sensor element. The sensor element and a first part of the support are embedded in a thermosetting molding compound, whereas the remaining part of the support and the terminal element are enclosed by a thermoplastic molding compound.

In the production process described in this reference, a first part of the support, which has already been provided with an electric circuit and is connected to a sensor element, is embedded in a thermosetting molding compound. Then, the unit produced in this way is introduced together with a second part of the support, which is not embedded in the thermosetting molding compound, and a terminal element into the interior of the housing. The intermediate spaces between the second part of the support and the housing and between the terminal element and the housing are filled with a thermoplastic molding compound.

A disadvantage of this sensor is that the thermosetting molding compound and the thermoplastic molding compound do not enter into a hermetically sealing bond, for example a chemical bond. Similarly, these molding compounds also do not enter into such a bond with a housing produced from metal. Therefore, at the two ends of the sensor, a liquid, in particular a liquid with a high surface tension such as water, is able, due to capillary forces, to penetrate into the intermediate space formed on the inner side of the housing between the housing on the one hand and the two molding compounds on the other hand. On account of the capillary forces, this water then moves up to the boundary surface between the two molding compounds. Since, as already stated, the two molding compounds themselves also do not enter into a sealing bond, this water can force its way into the gap formed between the molding compounds, until it reaches the support with the electric circuit. Electrical short-circuits can then occur there, ultimately making the entire sensor inoperative.

The known sensors are therefore not suitable for use under conditions with, in particular, cyclically changing temperatures, for example between 20° and 70° C., and high atmospheric humidity. This is because, in the case of cyclically changing temperatures, the molding compounds are subject to either tensile stresses or compressive stresses, depending on whether the temperature change is positive or negative, which may be considerable and on the one hand lead to gaps being formed on account of material fatigue and on the other hand the alternating stresses together with the correspondingly occurring capillary forces may lead to a 'pumping' of liquid into the gaps.

SUMMARY OF THE INVENTION

The present invention is therefore based on the object of improving a sensor of the generic type to the extent that it is hermetically sealed better, in particular with respect to liquids, while being simple and inexpensive to produce. In particular, it is intended to avoid liquid being able to penetrate into the inner region of the sensor, in particular into the region of the electric circuit.

This object is achieved according to the invention in the case of a sensor of the type described previously by the thermosetting molding compound having a smaller outside diameter, in at least a first region in the longitudinal direction of the housing and on the side of the housing facing away from the sensor element, than the inside diameter of the housing and by the thermosetting molding compound in the intermediate space thus formed between the thermosetting molding compound and the housing being enclosed in a positively engaging manner by a thermoplastic molding compound. The thermosetting molding compound may in this case also be enclosed in the intermediate space by the thermoplastic molding compound in a non-positively engaging manner.

The invention is consequently based on the idea of providing a mechanical seal, with a good liquid-sealing effect, instead of a chemical bond between the molding compounds on the one hand and the housing on the other hand by means of the positive or non-positive bond between the molding compounds.

The advantage of the proposed construction of the sensor is consequently that it is ensured by the positive and possibly non-positive contact of the thermoplastic molding compound with the outer side of the thermosetting molding compound that no gap can form in the longitudinal direction of the housing even when the sensor undergoes cyclical temperature treatment.

The effectiveness of the sealing can then still be improved considerably by the thermosetting molding compound having on its outer side at least one annular groove which is arranged essentially perpendicular to the longitudinal axis of the housing and into which the thermoplastic molding compound engages in an essentially positive manner. The annular groove preferably has a V-shaped or U-shaped cross-sectional profile. This shaping of the outer side of the thermosetting molding compound, to be precise before the thermoplastic molding compound is applied, achieves the effect that any liquid entering at the sensor ends cannot be drawn far into the sensor body merely on account of the capillary forces, since the annular groove or the annular grooves effectively prevent a continuous flowing movement of the liquid.

The fact that the thermosetting molding compound is held non-positively on the side of the housing having the sensor element and the thermoplastic molding compound is held non-positively on the side of the housing having the terminal element, produces a further special sealing effect. This is because it has the result that, when the sensor is subjected to a cyclically changing temperature, the one, mutually opposite side surfaces of the annular groove(s) are sealed off in the warming-up phase and the other side surfaces are sealed off in the cooling phase. This effect is explained in more detail in the part of the description relating to the figures.

In order that the sealing effect mentioned can also take place over a relatively great length in the longitudinal direction of the sensor, it may be further provided that the outside diameter of the thermosetting molding compound between the side of the housing having the sensor element and the side of the housing facing away from the sensor element is formed such that it decreases continuously or in stages.

For still further improvement of the sealing, it may also be provided that the thermosetting molding compound ends on the side of the support facing away from the sensor element in a region of the support in which the terminal element is provided on the surface of the support, i.e. in a region in which neither an electric circuit nor conductor tracks are arranged.

The object according to the invention is also achieved by a process for producing a sensor in which the sensor element and a first part of the support with the electric circuit outside the housing are firstly embedded in a thermosetting molding compound, the outside diameter of which is smaller than the inside diameter of the housing, in at least one first region in the longitudinal direction of the housing on the side of the sensor element facing away from the sensor. The unit thereby produced is then introduced together with a second part of the support, not embedded into the thermoplastic molding compound, and the terminal element into the interior of the housing. The intermediate spaces present in the first region between the thermosetting molding compound and the housing, between the second part of the support and the housing and between the terminal element and the housing are subsequently filled with a thermoplastic molding compound.

For the reasons already stated above, the process preferably provides that at least one annular groove arranged essentially perpendicular to the longitudinal axis of the housing is provided on the outer side of the thermosetting molding compound, in particular in the first region in the longitudinal direction of the housing. The annular groove or annular grooves may be produced by means of a suitable injection mold.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PRESENTLY PREFERRED EMBODIMENTS

Figure 1:
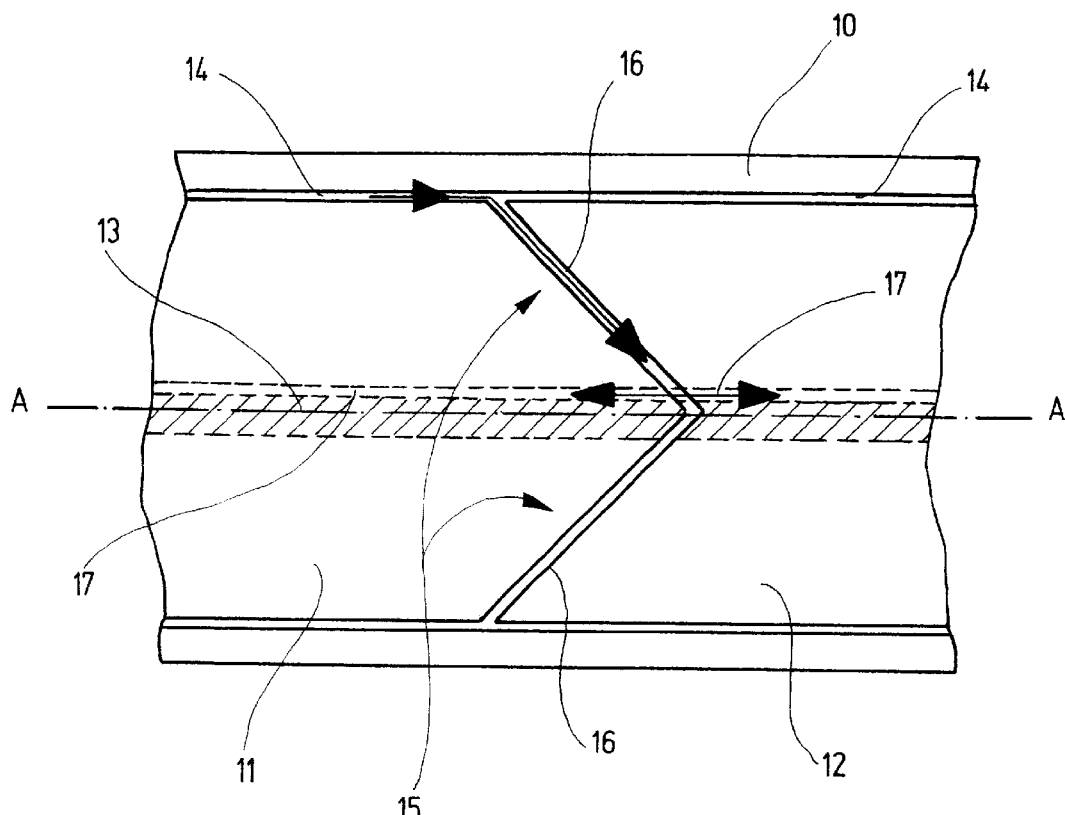
FIG. 1 shows a schematic enlargement of a detail of a sensor according to the prior art.

The enlargement of a detail of a sensor known from the prior art shown in FIG. 1 has a metal housing 10 made of steel, brass or the like, into which a thermosetting molding compound 11 and a thermoplastic molding compound 12 are positively fitted. In FIG. 1, the region of the sensor in which the two molding compounds 11, 12 meet each other is represented in particular.

At the level of the center axis 'A—A' of the housing 10 there is a printed-circuit board 13, which on one side of the contact surface of the two molding compounds 11, 12 is embedded in the thermosetting molding compound 11 and on the other side is embedded in the thermoplastic molding compound. On account of the arrangement shown of the housing 10, of the two molding compounds 11, 12 and of the printed-circuit board 13, various gaps are formed, into which a liquid, in particular a capillary-active liquid such as water, can penetrate and is moved in these gaps on account of the capillary forces thereby prevailing. The reason for the formation of these gaps is in particular that the molding compounds 11, 12 cannot enter into a chemical bond or adhesive bond with each other or with the metal housing for technical, material-related reasons.

On the one hand, a round gap 14, which runs peripherally through 360 degrees and reaches from one end of the sensor to the other end, is formed on the inner side of the housing 10. Formed at the same time at the contact surface 15 between the two molding compounds 11, 12 on both sides of the printed-circuit board 13 is an approximately planar gap 16, which is connected at the level of the center axis A—A to a further gap 17, which is formed between the printed-circuit board 13 and the respective molding compounds 11, 12 for the reasons mentioned. Typical gap widths lie in the range from 10 to 100 $\mu$m.

Said gaps 14, 16, 17 accordingly form a system of gaps or channels in which water which has once penetrated into the system on account of the capillary forces can move virtually unhindered. If this water then comes into contact with electrical components or conductors of the printed-circuit board 13, short-circuits, and consequently a total failure of the sensor, may occur.

Figure 2:
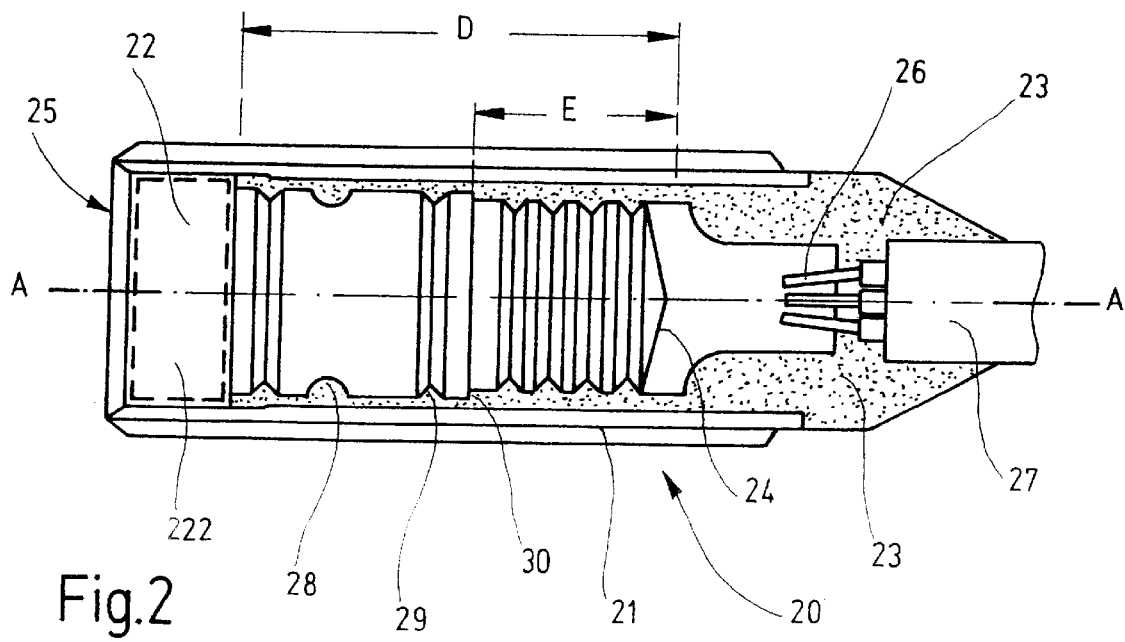
FIG. 2 shows a side view of a sensor according to the invention.

FIG. 2 then shows a lateral, partially sectioned view of a sensor 20 according to the invention. The sensor 20 has a housing 21, which is represented in a cut-open form and corresponds approximately to the housing 10 shown in FIG. 1. Arranged in the housing 21 is a thermosetting molding compound 22, which is encapsulated in a linear region 'D' in the longitudinal direction of the housing by a thermoplastic molding compound 23. The two molding compounds 22, 23 meet at a conical contact surface 24. The molding compounds 22, 23 are not represented in a sectioned form here.

On the left side of the housing 21 shown here, the thermosetting molding compound reaches up to the edge of the housing 21 and closes off the sensor 20 there in an approximately planar manner. A sensor element 222 is arranged in an opening on the left side of the housing and is embedded in he molding compound 22. Provided in an opening on the right side of the housing 21 there in an electrical terminal element 27, which is electrically connected via lines 26 to a printed circuit board (not represented here). The printed-circuit board is embedded into the two molding compounds 22, 23 approximately at the level of the center line A—A, according to FIG. 1, the thermosetting molding compound, 22 enclosing all the electrically active components and conductor tracks of the printed-circuit board.

Arranged on the outer side of the thermosetting molding compound 22 are annular grooves 28, 29, which completely surround the molding compound 22. The annular groove 28 has in this case a round cross section, whereas the annular groove 29 has a V-shaped profile. On account of the encapsulation, the thermoplastic molding compound 23 engages positively and possibly non-positively into these annular grooves 28, 29. A non-positive engagement can be achieved just by the thermoplastic molding compound being sprayed on at a higher temperature and consequently being under tensile stress after cooling, which leads to said non-positive engagement.

The outer shape of the thermosetting molding compound 22 also has a graduation 30, by means of which the two molding compounds can be fixed with respect to each other at the "supporting points" formed as a result (here the graduation 30). This has the special effect that the stress distribution between the two molding compounds 22, 23 in the linear region 'E' can build up virtually independently of the remaining stress distribution.

Figures 3A, 3B:
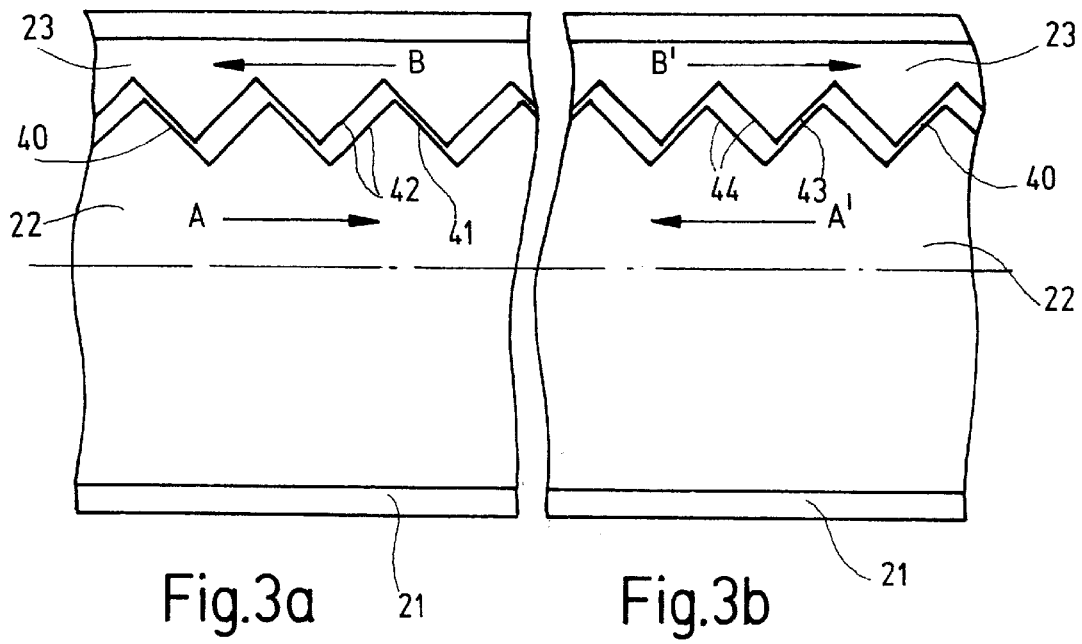
FIG. 3 shows a schematic enlargement of a detail of the sensor according to the invention shown in FIG. 2.

FIGS. 3*a* and *b* respectively show an enlargement of a detail of the sensor shown in FIG. 2, to be precise at the level of the linear region in which the thermosetting molding compound 22 is surrounded by the thermoplastic molding compound 23. It is now to be explained, with reference to the example of a triangular annular groove 40 represented, how the "special effect" mentioned at the beginning comes about in the sealing between the two molding compounds 22, 23.

A situation in which the two molding compounds 22, 23 are under a compressive stress which results from an increase in the temperature of the sensor is represented in FIG. 3*a*. Since, according to FIG. 2, the thermosetting molding compound 22 is fixed in this representation on the left-side end 25 of the housing and the thermoplastic molding compound 23 is correspondingly fixed on the right-side end of the housing, the assumed compressive stress leads to the thermosetting molding compound 22 expanding to the right in the drawing (arrow A) and the thermoplastic molding compound 23 expanding correspondingly to the left (arrow B), which is indicated by the arrows. Therefore, in this situation the groove surfaces 41 press against one another with a prestress, whereas the groove surfaces 42 form a gap. Typical material expansions in the case of thermosetting materials are approximately 10 to 30 ppm and in the case of thermoplastic materials 100 to 150 ppm. When there is a temperature difference of 100° C. and an assumed diameter of the sensor of 10 mm, accordingly a radial gap of approximately 0.2 mm forms.

FIG. 3*b* then shows the converse situation, in which the thermosetting molding compound 22 expands to the left in the representation (arrow A') and the thermoplastic molding compound 23 expands correspondingly to the right (arrow B'). Such a situation exists when the temperature of the sensor is reduced. In this situation, the groove surfaces 43 are pressed against one another, whereas a gap forms at the groove surfaces 44.

It can accordingly be seen from FIGS. 3*a* and *b* that the groove arrangement proposed according to the invention has the advantage that effective sealing is ensured both when there is an increase in the temperature and when there is a decrease in the temperature of the sensor. This is because the described groove sealing that is effective over a surface area takes place in both cases.

Figure 4:
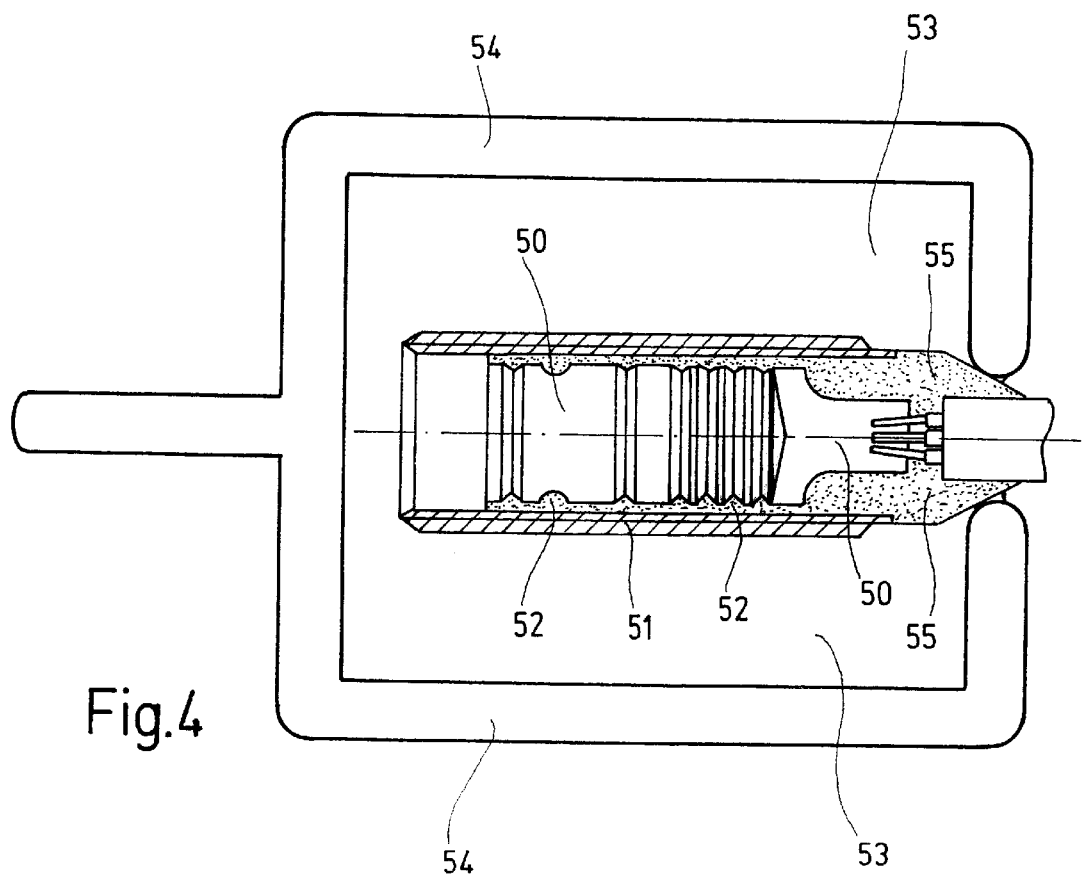
FIG. 4 shows a side view of an injection mold for the production of a sensor according to the invention.

In FIG. 4 it is finally shown how the sensor shown in FIG. 2 can be produced by means of an injection mold. An integrally formed unit 50, already embedded into a thermoplastic molding compound, already has annular grooves 52 on its outer surface. This unit 50 is introduced into a housing 51, which is embedded into an embedding compound 53 of the injection mold. In the position shown, the unit 50 is fixedly held. The thermoplastic molding compound 55 is then injected into the cavity formed via runners 54, and thereby fills in particular the gap formed in the region of the annular grooves 52 between the outer side of the thermosetting molding compound and the inner side of the housing 51. Once the cavities have been filled, the sensor has already been completed.

It should be noted that the sensor described can be used for example in the area of contactless movement sensing as a proximity switch in car-wash installations or the like.

Thus, while there have been shown and described and pointed out fundamental novel features of the present invention as applied to a preferred embodiment thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. A sensor, comprising: an electrical terminal element; a sensor element; a printed circuit board connected to the electrical terminal element and to the sensor element; and a housing defining an interior space for receiving the printed circuit board, the housing having an opening for the terminal element and an opening for the sensor element, the sensor element and at least part of the printed circuit board being embedded in a thermosetting molding compound, the thermosetting molding compound having a smaller outside diameter, in at least a first region in a longitudinal direction of the housing and on a side of the housing facing away from the sensor element, than an inside diameter of the housing so as to form an intermediate space, the thermosetting molding compound in the intermediate space formed between the thermosetting molding compound and the housing being enclosed partially with a positive fit by a thermoplastic molding compound.

2. A sensor as defined in claim 1, wherein the thermosetting molding compound is additionally enclosed in the intermediate space by the thermoplastic molding compound in a non-positively fitting manner.

3. A sensor as defined in claim 1, wherein the thermosetting molding compound has an outer side with at least one annular groove which is arranged substantially perpendicular to a longitudinal axis of the housing and into which the thermoplastic molding compound engages in a substantially positive manner.

4. The sensor as claimed in claim 3, wherein the annular groove has a V-shaped cross section.

5. A sensor as defined in claim 3, wherein the annular groove has a U-shaped cross section.

6. A sensor a defined in claim 1, wherein the thermosetting molding compound is additionally held non-positively on a side of the housing having the sensor element and the thermoplastic molding compound is held non-positively on a side of the housing having the terminal element.

7. A sensor as defined in claim 1, wherein an outside diameter of the thermosetting molding compound between a side of the housing having the sensor element and a side of the housing facing away from the sensor element is formed such that the thermosetting molding compound decreases one of continuously and in stages.

8. A sensor as defined in claim 1, wherein the thermosetting molding compound ends on a side of the board facing away from the sensor element in a region of the board in which the terminal element is provided on a surface of the board.

9. A sensor as defined in claim 1, wherein the thermosetting molding compound bears in a positively fit manner against an inner side of the housing in an end region of the housing arranged on a side of the sensor element and forms a front cover for the sensor element.

10. A process for producing a sensor, in which a printed circuit board is produced and is connected to a sensor element and a terminal element, and in which the printed circuit board, the sensor element and the terminal element are embedded in at least one molding compound arranged in an interior of a housing of the sensor, the process comprising the steps of: first, embedding the sensor element and a first part of the printed circuit board, where outside the housing, in a thermosetting molding compound having an outer surface diameter smaller than an inside diameter of the housing, in at least one first region in a longitudinal direction of the housing on a side of the sensor element facing away from the sensor so as to form a unit; next introducing the unit together with a second part of the circuit board, not embedded into the thermosetting molding compound, and the terminal element into the interior of the housing; and substantially filling intermediate spaces present in the first region between the thermosetting molding compound and the housing, between the second part of the circuit board and the housing and between the terminal element and the housing with a thermoplastic molding compound.

11. A process as defined in claim 10, including providing at least one annular groove arranged essentially perpendicular to a longitudinal axis of a housing on the outer surface of the thermosetting molding compound.

12. A process as defined in claim 11, including providing the groove in the first region in the longitudinal direction of the housing.

13. A process as defined in claim 11, including producing the at least one annular groove by injection molding.

14. A process as defined in claim 10, including fixing the unit for filling with the thermoplastic molding compound in the interior of the housing in a defined position with respect to the housing.

* * * * *